United States Patent [19]
Maue

[11] Patent Number: 5,336,990
[45] Date of Patent: Aug. 9, 1994

[54] ELECTRICAL TEST SHUNT HAVING DUAL CONTACT POINT MATING TERMINALS

[75] Inventor: H. Winston Maue, Farmington Hills, Mich.

[73] Assignee: United Technologies Automotive, Inc., Dearborn, Mich.

[21] Appl. No.: 2,854

[22] Filed: Jan. 13, 1993

[51] Int. Cl.5 ............................................. G01R 27/08
[52] U.S. Cl. .................................... 324/126; 324/713; 338/49; 338/322
[58] Field of Search .................. 324/126, 713; 338/49, 338/322, 330

[56] References Cited

U.S. PATENT DOCUMENTS

| 3,059,182 | 10/1962 | Smith | 324/126 |
| 4,034,289 | 7/1977 | Rozylowicz et al. | 324/126 X |
| 4,494,068 | 1/1985 | Ley et al. | 324/126 |

FOREIGN PATENT DOCUMENTS 59-191673 12/1984 Japan .

OTHER PUBLICATIONS

"A Comprehensive Guide To Resistive Shunts and Current Sensors", Vishay Electronic Components, Catalog CO191, Jan. 1991, pp. 1–18.

Primary Examiner—Walter E. Snow
Assistant Examiner—Glenn W. Brown
Attorney, Agent, or Firm—Harness, Dickey & Pierce

[57] ABSTRACT

An electrical test shunt having a pair of female contacts each having two contact points for relocating voltage sensing points of a test shunt to provide a first circuit path with an adequate current flow that is independent of a second circuit path for reading the voltage drop across the same electrical test shunt. The voltage is read by a high input impedance voltage comparator. The input impedance of the voltage comparator is great enough to negate the affect of the internal resistance inherent in the mating terminals of the shunt. The two circuit paths are made possible in part by the implementation of a pair of terminals which each have two independent electrical contact areas. The terminal contact is typically inserted into the female receptacle formed by the two separate (i.e. electrically isolated) electrically conducting contact points. The female terminal is preferably mounted in a suitable printed circuit board. When the terminals are inserted into the mating female contacts, the two electrically independent circuit paths are formed. One circuit path allows for easily and accurately measuring the voltage drop across the shunt, while the other allows adequate current flow to the load for testing purposes. The resistances of the contact points which are coupled to the voltage comparator are further coupled outside the current loop in which the load current flows.

8 Claims, 2 Drawing Sheets

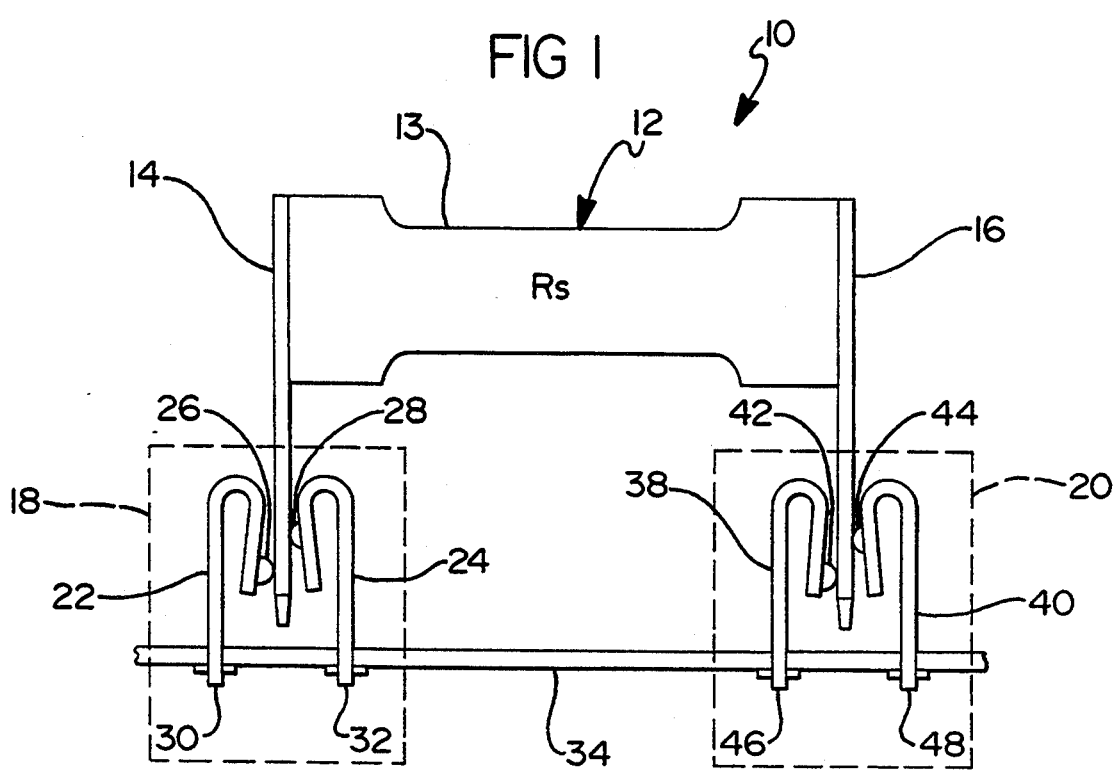
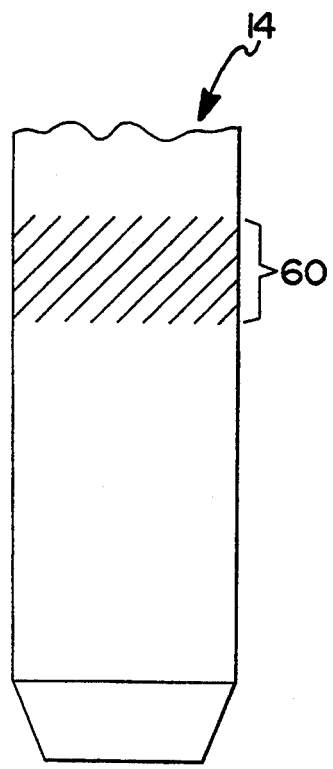
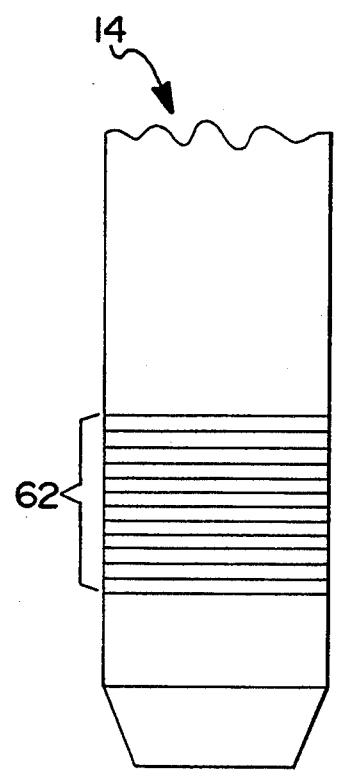

ELECTRICAL TEST SHUNT HAVING DUAL CONTACT POINT MATING TERMINALS

BACKGROUND OF THE INVENTION

This invention relates generally to electrical test devices and, more particularly, to electrical test shunts in which it is desired that the shunt be removable. Removable test shunts generally require at least a pair of mating terminals. The resistance of the shunt mating terminals greatly affects the resistance of the shunt and the accuracy of the current measurement. The amount of resistance added to the circuit is typically more than is acceptable to provide accurate current measurements. Furthermore, it is difficult to compensate for this additional resistance.

The prior art has not addressed the issue of providing mating terminals between a shunt element and a load circuit that do not adversely affect the performance of the current being measured. Accordingly, it is a principal object of the present invention to virtually eliminate the affect of terminal resistance in the measurement of a load current, when using a test shunt, by providing an easily removable electrical test shunt having terminals designed to eliminate the affect of these terminal resistances.

SUMMARY OF THE INVENTION

The above and other objects are accomplished by an electrical test shunt having dual contact point mating terminals in accordance with a preferred embodiment of the present invention. The shunt of the present invention incorporates relocating the voltage sensing leads thereof when coupling the shunt in a circuit to provide a separate circuit path for an adequate current test path that is independent of a circuit path for reading the voltage drop across the same electrical test shunt. The voltage is preferably read by a high input impedance voltage comparator. The input impedance of the voltage comparator is great enough to negate the affect of the internal resistance of the mating terminals of the test shunt. The two circuit paths are made possible by the implementation of the test shunt of the present invention, which has a pair of terminals each having two electrical contact areas. These contact areas are physically separated, while being electrically connected. The shunt is typically inserted into a pair of female receptacles, where each female receptacle is formed by two separate (i.e. physically separated) electrically conducting contact points. The contact points are positioned to make mating contact with the two contact areas of the two terminals. Each female terminal is preferably mounted in a suitable printed circuit board or other housing means.

Accordingly, when the shunt of the present invention is inserted into the mating female receptacles, two electrically independent circuit paths are formed. One circuit path allows for easily and accurately measuring the voltage drop across the shunt, while the other allows adequate current flow to the load for testing purposes. The two circuit paths further enable the shunt to be coupled within a current loop in which the load is included without the resistances of the terminals themselves affecting the measurements of load current to any appreciable degree.

BRIEF DESCRIPTION OF THE DRAWINGS

The various advantages of the present invention will become apparent to one skilled in the art by reading the following specification and subjoined claims, and by referencing the following drawings in which:

FIG. 1 is an enlarged side elevational view of one portion of the shunt of the present invention showing the shunt inserted into a circuit board by its two terminals and making electrical contact with its corresponding female receptacles; and FIG. 2A is an enlarged side elevational view of a portion of one terminal of the present invention showing one active electrical contact area;

FIG. 2B is a view of the portion of the terminal of FIG. 2A but from the opposite (i.e., 180° rotated) side showing the second electrical contact area;

DETAILED DESCRIPTION OF THE PREFERRED EMBODIMENT

Figure 3:
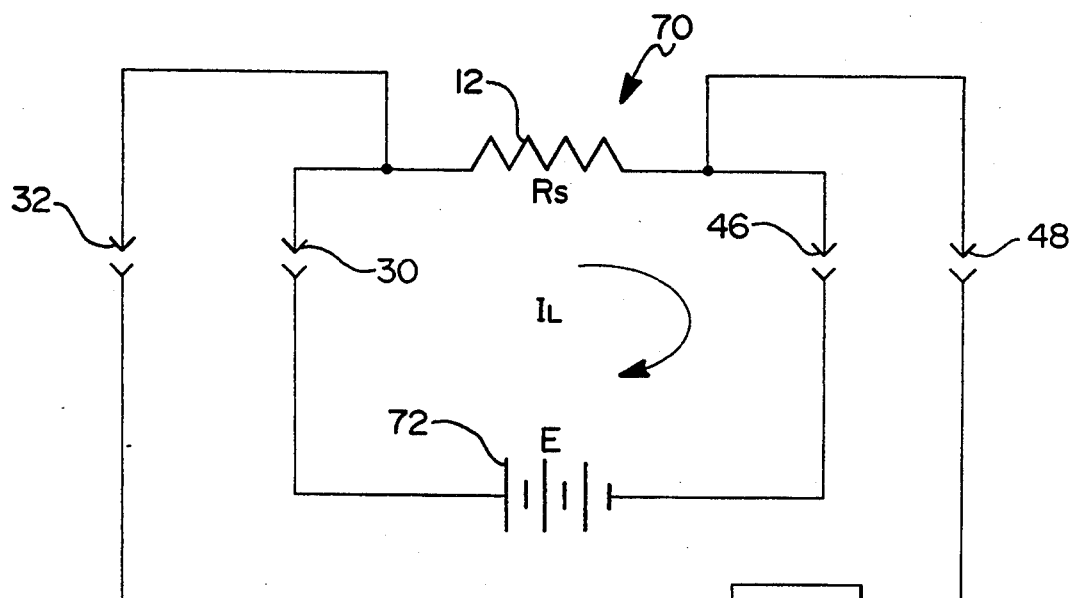
FIG. 3 is a circuit diagram of the preferred embodiment of the present invention showing how the shunt (Rs) is removably coupled to an external load, an external battery and an external comparator to form two independent circuit paths.

It should be understood from the outset that the present invention will be described in connection with a few limited examples which illustrate exemplary apparatus for practicing the invention at the time this application was filed. However, various modifications will become apparent to those skilled in the art after having the benefit of studying the text, drawings and claims which follow this detailed specification. With that in mind, the attention of the reader should now be turned to the drawings, especially FIG. 1.

Referring to FIG. 1, an enlarged side elevational view of the system 10 according to the preferred embodiment of the present invention is shown. The system 10 generally includes a shunt 12, having a main body portion 13, two connecting terminals 14 and 16, and two female receptacles 18 and 20. The connecting terminals 14 and 16 are generally inserted into the female receptacles 18 and 20, respectively. The female receptacle 18 generally includes first and second connecting arms 22 and 24, having first and second connecting points 26 and 28, respectively. The connecting arm 22 makes an electrical connection at connecting point 26 with the male connecting terminal 14 providing a first electrical input 30 to the circuit board 34. Similarly connecting arm 24 makes an electrical connection at connecting point 28 with male connecting terminal 14 to provide an electrical input 32 to circuit board 34.

Female receptacle 20 generally includes connecting arms 38 and 40 having connecting points 42 and 44, respectively, and electrical inputs 46 and 48, respectively. The connecting arm 38 makes an electrical connection at connecting point 42 with the male connecting terminal 16 providing a first electrical input 46 to the circuit board 34. Similarly, connecting arm 40 makes an electrical connection at connecting point 44 with male connecting terminal 16 to provide an electrical input 48 to circuit board 34.

Referring to FIG. 2A, a highly enlarged portion of the male connecting terminal 14 is shown in more detail.

The shaded region 60 makes an electrical connection with connecting point 28 of the male connecting terminal 14. With reference to FIG. 2B, the shaded region 62 makes an electrical connection with connecting point 26 of the male connecting terminal 14. It will be appreciated that while shaded regions 60 and 62 represent regions on opposite sides of the male connecting terminal 14 (i.e, they are 180° from each other), they are still electrically coupled. Also, it will be appreciated that connecting terminal 16 is preferably of identical construction to that of connecting terminal 14.

Referring to FIG. 3, the system 10 of FIG. 1 is shown in an electrical circuit diagram 70 consisting of the electrical inputs 30, 32, 46, and 48 as well as the shunt 12, a power supply 72, a load 74, and a comparator 76. The power supply 72 provides current through load 74, electrical input 30, and the electrical input 46 to the shunt 12. This comprises a current loop portion ($I_L$) of the circuit. A voltage loop portion of the circuit is comprised of the electrical input 32, the electrical input 48, and the comparator 76. The comparator 76 is preferably a high impedance input operational amplifier. The input impedance of the comparator 76 is high enough to virtually eliminate the current flow through the electrical input 32 and the electrical input 48.

It should also be appreciated that a principal advantage of the system 10 is the ability to locate the connecting points 32 and 48 across the shunt resistor 12 (Rs) "outside" of the current loop ($I_L$) of the circuit. This is accomplished principally by the use of the dual contact points 26, 28 and 42, 44 on the female receptacles 18 and 20, respectively, and the two points of contact made on each connecting terminal 14 and 16. Thus, since the resistances associated with connections 30 and 48 are outside of the current loop ($I_L$) they further help to reduce the affect on the voltage measurement made across the shunt resistor 12.

Figure 4:
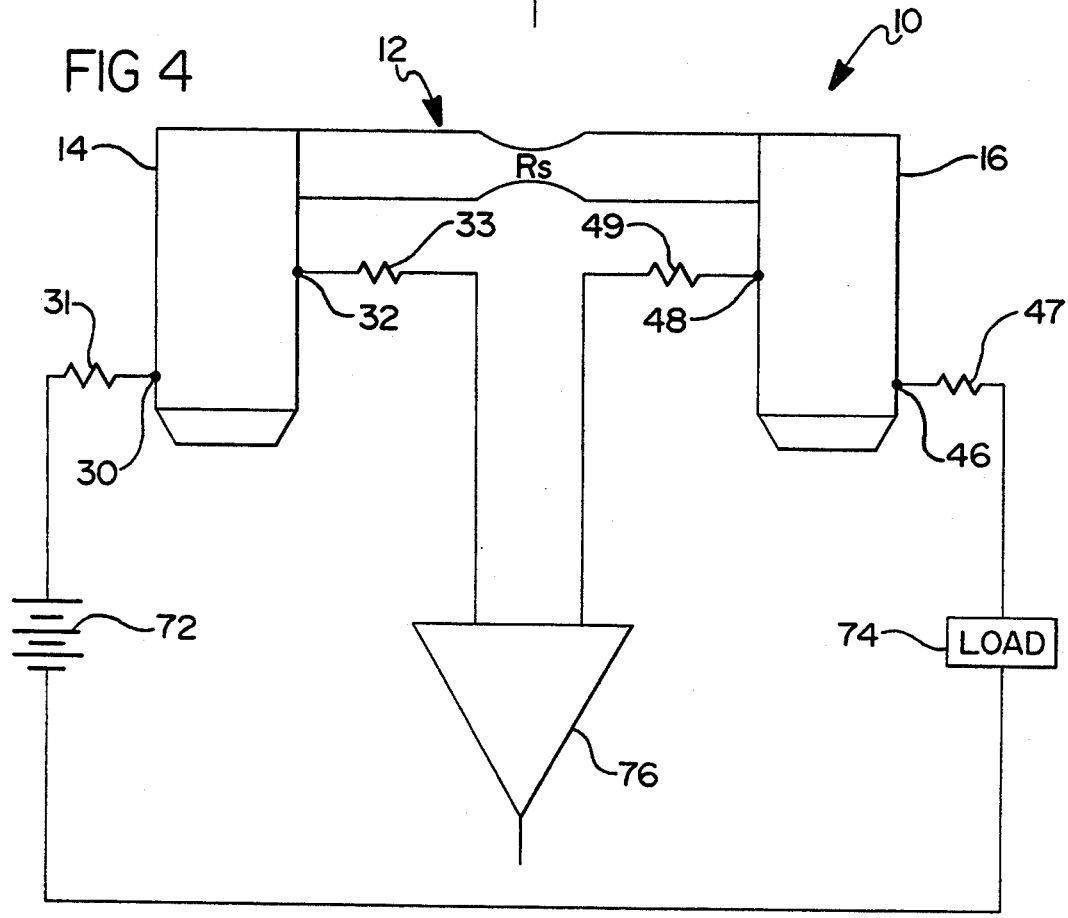
FIG. 4 is a circuit diagram of the preferred embodiment of the present invention showing how the internal resistances of the shunt are connected in a typical circuit.

Referring to FIG. 4, the system 10 is shown with electrical circuitry connected to a more detailed diagrammatic drawing of the shunt 12. Similar to FIG. 3, the electrical power supply 72 is connected to the male connecting terminals 14 and 16 through load 74 and electrical contact points 30 and 46. The inherent resistances 31 and 47 caused by contact points 30 and 46 are also shown. The comparator 76 is shown to be connected to the male connecting terminals 14 and 16 through electrical inputs 32 and 48. The inherent resistances caused by contact points 32 and 48 are also shown by resistances 33 and 49. Since comparator 76 is connected to the male connecting terminals 14 and 16 independently from the connection of the power supply 72 and load 74, and outside of the current loop ($I_L$), the affect of the resistances 33 and 49, as well as resistances 31 and 47, is virtually eliminated due to the high input impedance of comparator 76. Therefore, extremely accurate current measurements are possible.

It should be appreciated, that in the preferred embodiment of the present invention all of the components of the present invention are made from widely available materials in accordance with widely known and implemented construction techniques.

Those skilled in the art can now appreciate from the foregoing description that the broad teachings of the present invention can be implemented in a variety of forms. Therefore, while this invention has been described in connection with particular examples thereof, the true scope of the invention should not be limited since other modifications will become apparent to the skilled practitioner upon study of the drawings, specification and following claims.

What is claimed is:

1. A shunt for coupling to a circuit forming a first current loop within which an external load is disposed in a manner such that terminal resistances of the shunt do not significantly affect voltage measurements made by a voltage sensing apparatus when said shunt is coupled within said first current loop, said shunt comprising:

a shunt member having a main body portion and a plurality of terminals electrically coupled thereto;

said plurality of electrical terminals being operable to couple said main body portion to said first current loop to form a second current loop independent of said first current loop; and said terminals being further operable to enable an external voltage sensing apparatus to be coupled across said main body portion of said shunt such that said terminal resistances of said shunt do not significantly affect said measurements made by said voltage sensing apparatus.

2. The shunt of claim 1, wherein said plurality of electrical terminals includes:

at least a pair of male connecting terminals electrically coupled to said main body portion of said shunt;

at least a pair of female receptacles for matingly coupling with said male connecting terminals to couple said shunt within said current loop; and said female receptacles each having first and second contact portions for enabling said shunt to be coupled within said current loop while enabling said voltage sensing apparatus to be coupled across said shunt to form a second current path, to thereby prevent said terminal resistances from significantly influencing said voltage measurements.

3. A shunt for coupling to an external load placed within a current loop and an external voltage sensing apparatus in a manner such that terminal resistances of the shunt do not significantly affect voltage measurements made by the voltage sensing apparatus when said shunt is coupled within said current loop, said shunt comprising:

a shunt member having a main body portion including a pair of terminals, where each said terminal includes first and second electrical contact areas electrically coupled in parallel with said main body portion;

a pair of female receptacles, each said female receptacle having first and second contact portions for electrically mating with said first and second electrical contact areas, respectively, of said terminals;

said first electrical contact areas of said terminals and said first contact portions being coupled such that said shunt member is placed in said current loop; and said second electrical contact areas of said terminals and said second contact portions being coupled such that said second electrical contacts and said contact portions are outside of said current loop and coupled to said voltage sensing means.

4. The shunt of claim 3, wherein said shunt is removable.

5. The shunt of claim 3, wherein said first and second contact portions of each of said pair of female receptacles is connected to a circuit board.

6. A removable shunt for coupling to an external load placed within a current loop and an external voltage sensing apparatus in a manner such that terminal resistances of the shunt do not significantly affect voltage measurements made by the voltage sensing apparatus when said shunt is coupled within said current loop, said shunt comprising:
- a shunt member having a main body portion including a pair of terminals, where each said terminal includes first and second electrical contact areas electrically coupled in parallel with said main body portion;
- a pair of female receptacles, each said female receptacle having first and second contact portions for electrically mating with said first and second electrical contact areas, respectively, of said terminals;
- said first electrical contact areas of said terminals and said first contact portions being coupled such that said shunt member is placed in said current loop; and
- said second electrical contact areas of said terminals and said second contact portions being coupled such that said second electrical contacts and said contact portions are outside of said current loop and coupled to said voltage sensing means.

7. The shunt of claim 6, wherein said first and second contact portions of each of said pair of female receptacles is connected to a circuit board.

8. A removable shunt for coupling to an external load placed within a current loop and an external voltage sensing apparatus in a manner such that terminal resistances of the shunt do not significantly affect voltage measurements made by the voltage sensing apparatus when said shunt is coupled within said current loop, said shunt comprising:
- a shunt member having a main body portion including a pair of terminals, where each said terminal includes first and second electrical contact areas electrically coupled in parallel with said main body portion;
- a pair of female receptacles, each said female receptacle having first and second contact portions for electrically mating with said first and second electrical contact areas, respectively, of said terminals, wherein said first and second contact portions of each of said pair of female receptacles is connected to a circuit board;
- said first electrical contact areas of said terminals and said first contact portions being coupled such that said shunt member is placed in said current loop; and
- said second electrical contact areas of said terminals and said second contact portions being coupled such that said second electrical contacts and said contact portions are outside of said current loop and coupled to said voltage sensing means.

* * * * *